(12) United States Patent
Dittes et al.

(10) Patent No.: US 10,411,000 B2
(45) Date of Patent: Sep. 10, 2019

(54) MICROELECTRONIC PACKAGE WITH ILLUMINATED BACKSIDE EXTERIOR

(71) Applicant: Intel IP Corporation, Santa Clara, CA (US)

(72) Inventors: Marc Stephan Dittes, Regensburg (DE); Sven Albers, Regensburg (DE); Christian Georg Geissler, Teugn (DE); Andreas Wolter, Regensburg (DE); Klaus Reingruber, Langquaid (DE); Georg Seidemann, Landshut (DE); Thomas Wagner, Regelsbach (DE); Richard Patten, Langquaid (DE)

(73) Assignee: Intel IP Corporation, Santa Clara, CA (US)

( * ) Notice: Subject to any disclaimer, the term of this patent is extended or adjusted under 35 U.S.C. 154(b) by 648 days.

(21) Appl. No.: 15/087,477

(22) Filed: Mar. 31, 2016

(65) Prior Publication Data
US 2017/0284636 A1    Oct. 5, 2017

(51) Int. Cl.
*F21V 15/00*    (2015.01)
*H01L 25/16*    (2006.01)
*H01L 23/31*    (2006.01)

(52) U.S. Cl.
CPC ........ *H01L 25/167* (2013.01); *H01L 23/3128* (2013.01); *H01L 2224/16225* (2013.01); *H01L 2224/73257* (2013.01); *H01L 2924/15311* (2013.01); *H01L 2924/181* (2013.01)

(58) Field of Classification Search
CPC ....... H01L 33/486; H01L 24/24; H01L 24/82; H01L 23/3128; H01L 2924/181; H01L 2924/15311; H01L 2224/73257; H01L 2224/16225

See application file for complete search history.

(56) References Cited

U.S. PATENT DOCUMENTS

| 9,136,258 B1 | 9/2015 | Wang et al. |
| 2009/0001397 A1* | 1/2009 | Fine ..................... G02B 6/0018 257/98 |
| 2009/0042320 A1* | 2/2009 | Wang ................. H01L 21/6715 438/5 |
| 2009/0152665 A1* | 6/2009 | Tseng .................... H01L 25/167 257/461 |

(Continued)

FOREIGN PATENT DOCUMENTS

| KR | 10-0851048 | 8/2008 |
| KR | 10-2010-0068998 | 6/2010 |

OTHER PUBLICATIONS

PCT International Search Report and Written Opinion of the International Searching Authority for International Application No. PCT/US2017/013060, dated Apr. 21, 2017, 10 pages.

(Continued)

*Primary Examiner* — Thien T Mai
(74) *Attorney, Agent, or Firm* — Schwabe, Williamson & Wyatt, P.C.

(57) ABSTRACT

A microelectronic package is described with an illuminated backside exterior. In one example, the package has a package substrate, a die attached to the package substrate, a cover over the die and the package substrate, a lamp, and a screen over the die, externally visible and optically coupled to the lamp so that when the lamp is illuminated the illumination is externally visible through the screen.

20 Claims, 5 Drawing Sheets

(56) References Cited

U.S. PATENT DOCUMENTS

| | | | |
|---|---|---|---|
| 2009/0169071 A1 | 7/2009 | Bond et al. | |
| 2011/0121461 A1* | 5/2011 | Lim | H01L 21/568 |
| | | | 257/773 |
| 2011/0215341 A1 | 9/2011 | Bond et al. | |
| 2012/0104450 A1* | 5/2012 | Chen | H01L 33/486 |
| | | | 257/99 |
| 2014/0061909 A1* | 3/2014 | Speckels | H01L 24/83 |
| | | | 257/741 |
| 2016/0111559 A1* | 4/2016 | Inoue | H01L 31/048 |
| | | | 136/256 |

OTHER PUBLICATIONS

International Preliminary Report on Patentablity for International Patent Application No. PCT/US2017/013060 dated Oct. 11, 2018, 8 pages.

* cited by examiner

MICROELECTRONIC PACKAGE WITH ILLUMINATED BACKSIDE EXTERIOR

FIELD

The present description relates to packages for microelectronic devices and in particular to illumination for such packages.

BACKGROUND

In the production of microelectronic chips, a wafer is first processed to form the microelectronic parts and circuits, and then diced into many individual dies. One or more dies are then packaged together for protection against the elements and in some cases to make the packages easier to handle and install. The package has an array of connections on one side and a plastic cover or a resin that is molded over the package on the other side. Sometimes other protective materials are used as alternatives.

The side opposite the electrical connections is typically a dull black color that is marked in white with a number to indicate the type of die inside and the manufacturer. The name of the manufacturer may be spelled out or indicated by the number. There may also be batch numbers or date references in various coded numbers and letters printed on the package. In a few cases, there is a symbol or graphic legend marked on the package. After these packages are mounted to a printed circuit board, the white markings are facing up away from the board and are legible in most cases by a shopper or service technician. When the package is covered with a heat sink or heat fins, then the product number may not be visible.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
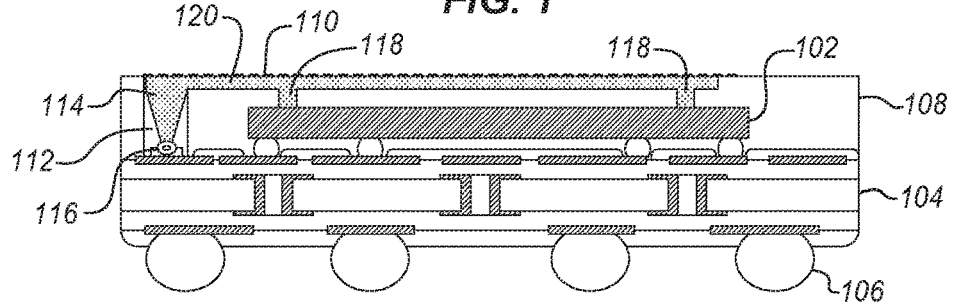
FIG. 1 is a cross-sectional side view diagram of a package with an illumined back side according to an embodiment.

Most packages, no matter the manufacturer, look very similar. The markings on the black rectangular body of the package are dull and difficult to read. The packages are normally quite unattractive and useless for marketing and advertising. This type of package marking has been developed to allow service technicians to identify replacement parts and for assembly lines to identify components for binning and installation. The markings are not designed to boost brand or customer loyalty. In most cases, a shopper or user never sees the printed circuit boards inside a device. In most cases, users are discouraged from opening housings in order to look at the packages mounted on the printed circuit boards inside.

There is one exception to the "no user-serviceable parts inside" approach to product design. The market for build-your-own personal computers survives and has many enthusiasts. These customers buy a motherboard, a processor, a mass storage drive, a video card, a power supply and other parts and assemble the parts together into a case. Each component is carefully selected by the builder for the capabilities that the computer is being built to perform. Many of the parts are built to attract attention from potential purchasers and in some cases, the parts are labeled and marked to attract the buyer's notice and even to impress others or beautify the resulting computer. Motherboards may have bright blue, red, or green parts and labels. Lights are sometimes added and included in many cooling fans. Many housings have transparent panels or windows to allow the builder and others to see the parts inside the housing without opening the case.

As described herein, the backside of a package may be enhanced with illuminated colors, shapes and legends. In one example, a thin semi-transparent or clear insert may be formed in the shape of a company logo or any other shape on the top of the package. PMMA (PolyMethyl Methacrylate) or any other suitable material may be first molded or cut into a suitable form and then attached directly on top of the package or at some distance above the die. A spacer or standoff may be used to properly position the insert and then an optical connection may be used to illuminate the insert.

In some embodiments, a micro LED (Light Emitting Diode) may be mounted next to a die in the package. It may be mounted on the package substrate and provided a separate connection to an external power supply. When the micro LED is powered (e.g. during operation of the machine) the semitransparent form of the insert will be illuminated through a light channel coupling light from the micro LED to the insert. This may be used to draw attention to the packaged component on the board. Multiple micro LEDs may be coupled to the same insert to provide different colors. The different colors may be used to indicate a particular status, such as standby, operating, off, wireless mode, connecting, etc.

The micro LED and insert produce a unique and distinctive visual impression. This may be used to boost awareness of or brand loyalty for the manufacturer or to stimulate sales for unique illuminated products over competing products. The illuminated package may be used in a device that has a transparent exterior housing or cover so that the lighting on the package shows through the outside of the device to a user. This may be used to attract attention to the components inside or to the corresponding manufacturer or both.

The illuminated package may feature a logo or name of a systems integrator. A package manufacturer may produce components that feature a logo of a customer, such as a phone, computer, wearable or other systems integrator so that when the manufactured device is powered or a particular mode is activated, then the illuminated package back side may be seen with an identifier of the phone maker or the activated service, such as a wireless network, remote speaker function or other service. This may provide a more compact and a simpler way to provide lighting than with a separate LED in the housing.

For the computer builder, an illuminated package provides an additional area of interest for case windows. A motherboard or adapter card with illuminated packages provides even more visual interest than those with brightly colored sockets and heat sinks. While a computer case window or transparent side panel provides a large view of many of the parts inside, a more tailored approach may be used for very particular packages. For some types of devices, a very specifically dimensioned window or cutout may be made in a housing directly over an illuminated package so that only the package illumination is visible. This allows lighting effects to be provided in a very specific and visible location.

Mobile cellular telephones have been made with transparent outer covers that allow a user and others to see the packages and circuit boards inside. An illuminated package allows for a more interesting view inside the device. With a transparent cover, an illuminated package may be made to provide lighting when desired or to provide interesting lighting effects. The package may also indicate when a key feature is on or off. A mobile device may have a cover that is only transparent in a small area so that only the illuminated package is visible through the transparent part.

FIG. 1 is a cross-sectional side view diagram of an example of a package with an illumined back side. The package has a die 102 attached to a package substrate 104 using a solder ball array or other type of pads and attachments. Opposite the die, the substrate has a land grid array, solder ball array 106 or other connection interface to a socket, motherboard or other connection. On the same side as the die, the substrate has a cover 108. The cover may be plastic or metal and glued or snapped into place or it may be a mold compound that is applied over the die and the substrate and then cured in place.

The illustrated package configuration is a standard flip chip package with a single die as may be common with processors, solid state memory, system-on-a-chip (SoC) and other types of larger discrete dies. The package substrate acts as a redistribution layer and the cover seals the die for physical protection from the environment and from stresses that may occur during manufacturing and installation. However, the embodiments are not so limited. There may be more than one die on the substrate. The additional dies may be beside or over the single illustrated die. The die may be connected to the substrate by wires instead of or in addition to the solder balls. The package may include additional structures (not shown) such as heat spreaders, external connectors, cooling plates, etc.

Regardless of the overall structure of the package, the package is augmented in this example with a micro LED 116 on the package substrate. LEDs are available with power consumption in the milliwatt range with a footprint of 1 mm or less and in various colors. The micro LED in this example is mounted on its own substrate and the micro LED package may have LEDs in one or multiple colors. The micro LED package 116 is mounted to and electrically connected to the package substrate 104.

The micro LED 116 is optically mounted in or coupled to a cavity 112 in the package cover 108. This cavity is filled with an optical guide 114 that connects to a chamber 120 over the back side of the package cover 108. The chamber is defined by the mold compound or the cover 108 and filled with a diffusion screen. The optical guide and the screen may be made of any suitable material that conveys light. Clear PMMA may be used for example. A diffusing structure or material may be added to the optical guide 114 and screen 120 to diffuse the light that comes from the LED. A diffusion surface 110 is attached over the screen through which the light may be seen. The surface may be patterned or shaped as desired to obtain the desired effect. As an example, the surface may have a diffusion surface, a Fresnel surface, or a matte surface molded into either the top or the bottom side.

The screen 120 and the diffusion surface 110 may be a single integral piece formed from PMMA, a resin, or any other suitable silicon or acrylic material. The single integral piece may be in the form of the insert described above. It may be colored with a die to produce a particular desired color or it may be transparent so that the LED determines the color.

The screen may be supported by the package cover 108. Alternatively, or in addition, standoffs 118 may be used to support the screen over the die. In this example, the standoffs rest against the top of the die to support the screen a specific distance over the die. The standoffs may be a separate part or integrated with the screen and also integrated with the diffusion surface. If the die has been polished, or mechanically finished on the back side, then the die has a flat surface that ensures that the standoffs have an even base across the die. The screen will then be maintained level across the back of the package.

Figure 2:
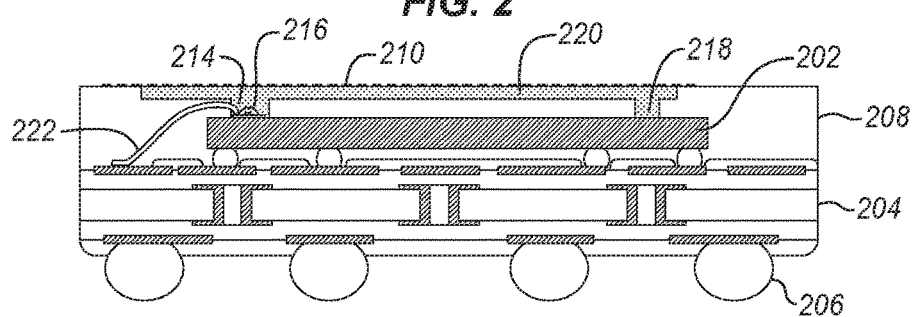
FIG. 2 is a cross-sectional side view diagram of an alternative package with an illumined back side according to an embodiment.

FIG. 2 shows an alternative package with an illuminated backside. In this example a die 202 is mounted to a package substrate 204. As in FIG. 1, the package substrate also serves as a redistribution layer between the die on one side and a ball grid array 206 on the other side. The ball grid array may be attached to a socket, a circuit board or any other suitable surface. A cover 208 is attached over the die as in the previous example, and a screen 220 is attached to or mounted to the top of the cover.

To illuminate the screen in this example, one or more micro LEDs 216 are attached to the top of the die 202. The LEDs are coupled through a short light guide 214 into a light chamber filled by the screen 220 below a diffusion surface 210. The light guide may also serve as a standoff 218 to position the screen and the surface over the die 202. There may be additional standoffs 218 under the screen to support the screen across its total area.

The LED 216 is physically connected to the top or back side of the die, but electrically connected to the package substrate 204 just as the LED of the previous example was electrically connected to the package substrate. The LED may be mounted in a type of package or holder or it may simply have exposed connections. Since the back side of the die is dielectric and the cover is also dielectric, any exposed connections whether in a holder or not may be electrically connected to the substrate using wire leads 222. While a single wire lead is shown between the LED and the substrate, there may be two to provide a voltage or more wire leads to provide different voltages for different brightness levels or for different colors.

In a simple example, the LED is coupled to the power bus in the substrate so that whenever the package receives power, from a socket, a motherboard, or other external source, the LED receives power and is activated and fills the optical guide 114 with light to illuminate the screen and diffusion surface of the insert. For more complex effects, the LED) may be coupled using multiple pins through the substrate to a remote controller that drives the LED to produce any desired lighting effects. The remote controller may be in another component on the system board or in a nearby package or in the same package with the die. In another example, the LED may be controlled by the die which is connected through the substrate or by a separate controller in the package.

Figure 3:
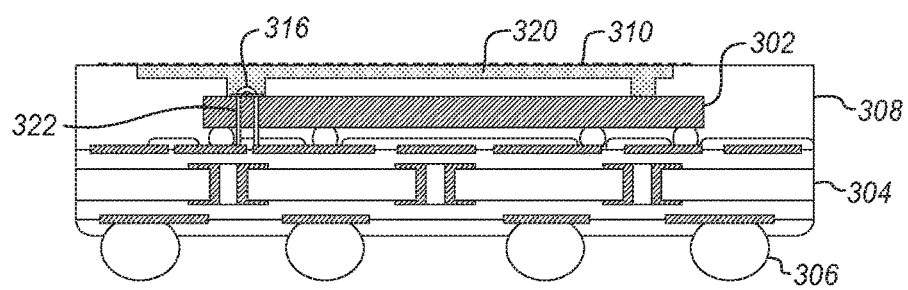
FIG. 3 is a cross-sectional side view diagram of a further alternative package with an illumined back side according to an embodiment.

FIG. 3 is a cross-sectional side view diagram of an alternative package in which the LED is connected through the die. A die 302 is mounted to the package substrate 304. The package substrate has a ball grid array 306 to mount to an external fixture. The die has a cover 308 which includes an insert over the die. The insert has a light chamber in the form of a screen 320 and a diffusion surface 320 optically coupled to an LED 316 all over the back side of the die. When the LED is activated the screen is illuminated to provide an interesting visual effect.

In this example, the die 302 has a set of through silicon vias 322 from the top side of the die to electrically connect with the LED. The vias may connect either to active circuitry of the die or through the die to the package substrate 304.

If the vias connect to active circuitry of the die, then the die may contain controller circuitry to control the LED. The circuitry may control brightness, color and status so that the LED may provide interesting effects, status notifications, or both. Multiple LEDs may be mounted to the back side of the die and electrically connected to the die in the same way.

If the vias connect through the die to the package substrate, then the LED may be connected to any of a variety of different components through the substrate as mentioned before with respect to FIG. 1. The LED) may be connected through the substrate directly to power, to an external controller in the device, to the die or to another die in the device that is provided for controlling the LED.

Figure 4:
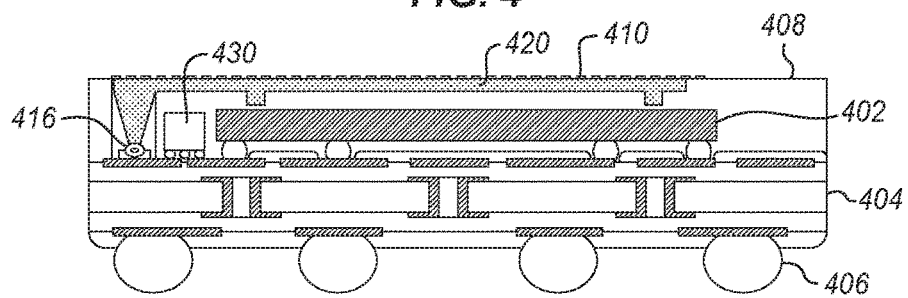
FIG. 4 is a cross-sectional side view diagram of a further alternative package with an illumined back side according to an embodiment.

FIG. 4 is a cross-sectional side view diagram of an alternative package that includes an additional die for controlling the operation of one or more LEDs for illuminating the back side of the package. A die 402 is mounted to a substrate 404 which provides redistribution from the die to a ball grid array 406 on the other side of the substrate similar to the other examples. The package has a cover 408 and the light screen 420 and diffusion surface 410 in or on the cover as in the previous examples. The screen is illuminated by an LED 416 that is mounted to the substrate, however the LED may alternatively be mounted to the die. There may be multiple LEDs in different locations to provide different lighting effects.

A light controller die 430 is also mounted to the substrate, although it could be mounted in other locations including the back side of the die. The controller is coupled to the LED either through internal wiring layers of the substrate or through surface traces. The controller receives power through the substrate and provides power to the LED to drive the LED. The controller may be coupled to the die to receive status and alerts and to drive the LED to provide an indication of the status or alerts. Alternatively, the controller may act autonomously to generate lighting effects.

Figure 5:
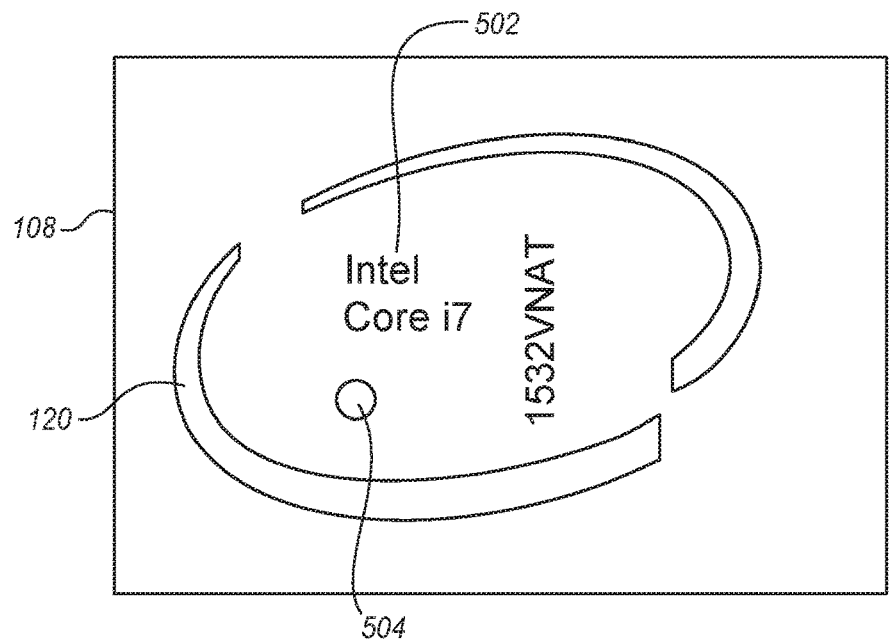
FIG. 5 is a top plan view diagram the back side of a package with an illumined back side according to an embodiment.

FIG. 5 is a top plan view of the package of FIG. 1. In this view only the cover 108 and the screen 120 are visible. Light from the LED may illuminate the screen in any one or more colors to provide distinctive colored logos, symbols, and other effects. The screen also includes a single white indicator 504 as a power indicator. This indicator may be illuminated by the same LED but using a different screen or chamber to produce a different color. Alternatively, a different LED may be used to produce a different color of light or to provide light at different times to indicate different information. In one example, the logo screen 120 is activated whenever the die is powered, while the white screen 504 acts as a status indicator. There may be different status indicators to provide different information and there may be different colors for a single status indicator as mentioned above.

The top of the package also has printed product information 502. This information may include product names, company names, and product numbers. The information is normally printed with an indelible white ink as mentioned above so that a technician is able to identify the part whether the part is powered or not.

While the above descriptions are in the context of LEDs, any other type of lamp may be used. OLEDs may be used with a more diffuse structure. For example, an OLED material may be applied across the light chamber and then electrically connected to the die or the substrate. OLED material may alternatively be applied to the back side of the die. The illumination may then be coupled through light guides to a chamber over the back side of the guide.

Figure 6:
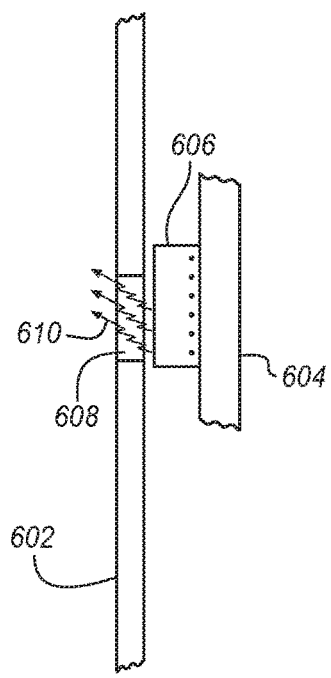
FIG. 6 is a side view diagram of package with an illumined back side incorporated into a part of a device according to an embodiment.

FIG. 6 is a side view diagram of a package with an illuminated back side incorporated into a portion of a device. The device has a housing 602 of which only one side is shown. A motherboard 604, or other type of circuit board, is mounted in the interior of the housing. A package 606 with an illuminated back side is attached to the circuit board as described above. The package produces illumination 610 when activated for status, power, or decoration.

The housing is made from an opaque material except for a window 608 in the housing that is near the package. The window may be a particular shape to provide a specific appearance or it may be a more general shape so that the appearance of the screen on the back side of the package may be seen. The window may be made of a solid transparent material, such as acrylic, glass, silicon, industrial sapphire, or some other material or it may be an opening through the housing. The housing may be sealed against the package or in some other way to protect the parts inside, if desired.

Figure 7:
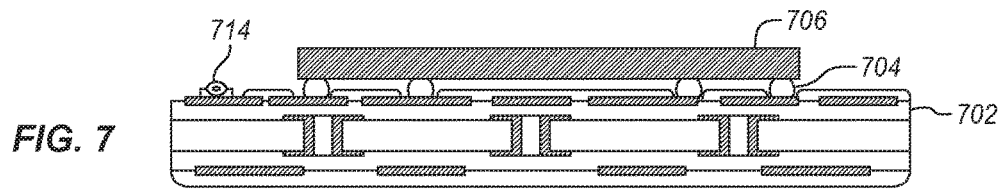
FIGS. 7-11 are cross-sectional side view diagram of fabrication stages of a package such as that of FIG. 1 according to an embodiment.

FIGS. 7-11 are cross-sectional side view diagrams of fabrication stages of a package such as that of FIG. 1 with an illuminated backside. A similar approach may be used to produce a package such as that of FIG. 1. In FIG. 7 a die 706 has been attached over a substrate 702, such as a package substrate, with a solder ball array 704, land grid array or similar attachment. One or more LEDs 714, such as microLEDs are attached to the top surface of the package substrate near the die. These LEDs may be controlled by the die, by a separate or external controller or simply powered with the die, as described above. The LED may be in a carrier that is soldered to the substrate on pads that are provided for that purpose. Alternatively, the LED may be a bare diode with exposed leads that are attached to the substrate.

Figure 8:
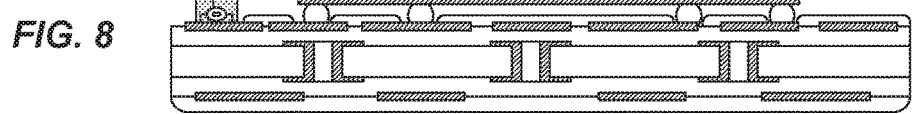
Figure 9:
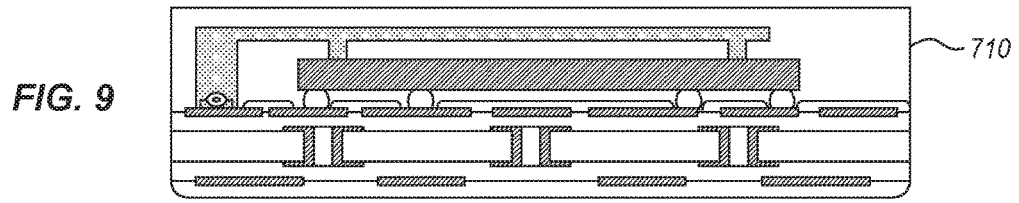
Figure 10:
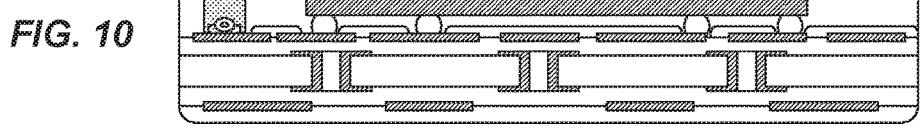
Figure 11:
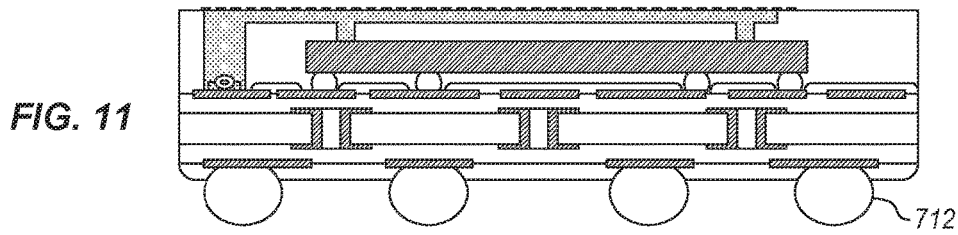

In FIG. 8 a transparent screen structure 708 made of a suitable transparent and diffusion material is attached to the substrate 702 and over the die 706 and the LED 714. In FIG. 9 the screen structure, the die and the substrate are covered with a mold compound 710 such as a suitable polymer resin-based encapsulant. In FIG. 10, the mold compound is thinned by grinding and polishing so that the back side of the screen structure is revealed. In FIG. 11, the package is finished with a solder ball array 712 attached to each of the contact pads of the substrate.

Figure 12:
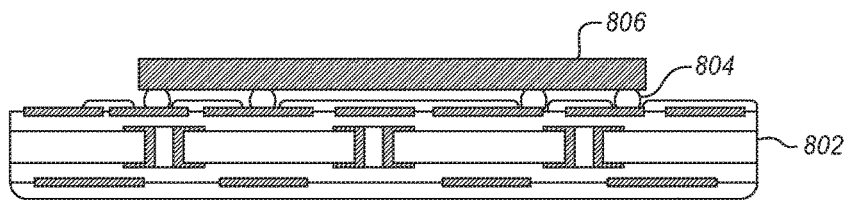
FIGS. 12-16 are cross-sectional side view diagram of fabrication stages of a package such as that of FIG. 2 according to an embodiment.
Figure 13:
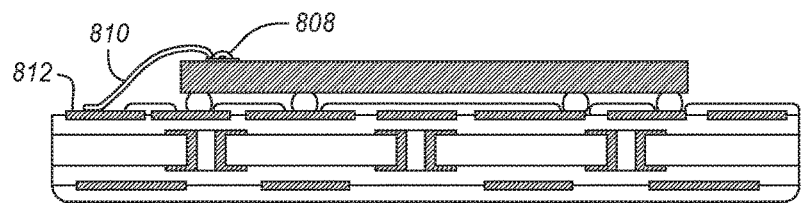

FIGS. 12-16 are cross-sectional side view diagrams of fabrication stages of a package such as that of FIG. 2 or 3 with an illuminated backside. In FIG. 12 a die 806 is attached to a substrate 802, such as a package substrate, with a solder ball array 804. In FIG. 13 one or more LEDs 808 is attached over the top of the die in one more different locations e.g. by soldering, and one or more wire 810 are connected from the LED to a suitable power pads 812 on the substrate. These pads power the LED through the wires. The pads may be controlled by the die, by a separate controller, or simply connected with external or internal power as described above.

Figure 14:
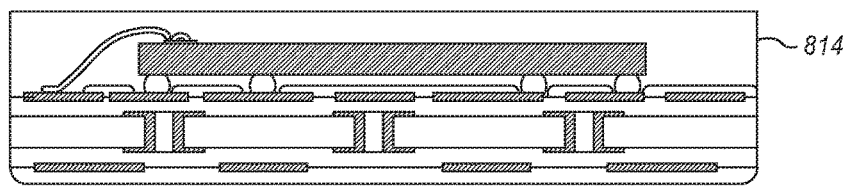
Figure 15:
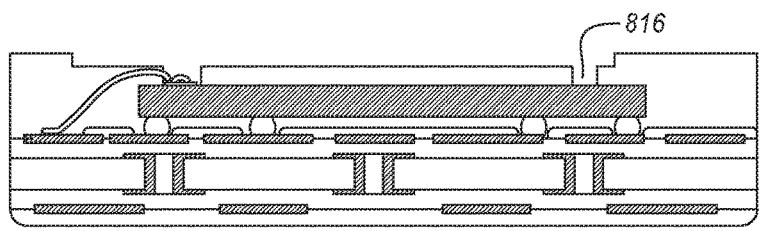

FIG. 14 shows the entire structure with substrate, die, LED, and wires being covered in an encapsulant 814 or mold compound. In FIG. 15, the mold compound is opened in a particular shape to form a well 816. This may be done using a wet chemical etch, laser milling, or other processes. The well includes an opening over the LED to allow light from the LED to be released. The well also includes a main body with a particular shape, such as that shown in FIG. 5, 504, or in any other shape.

Figure 16:
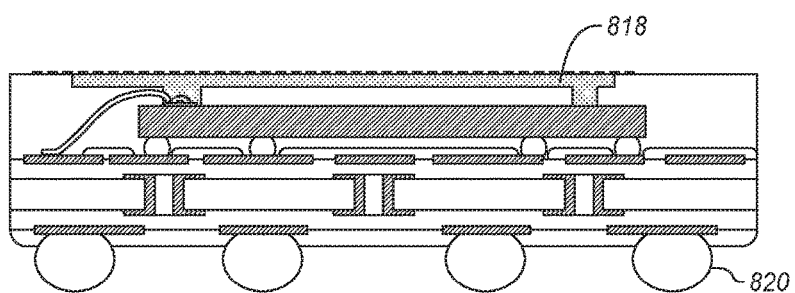

In FIG. 16 the package is finished with solder ball attachments 820 added to one side of the package and with a screen structure 818 applied into the well. Any suitable material such as PMMA or acrylic may be used in the well. Many materials may be poured into the well and then cured to harden in place. The top of the package including the mold compound and the screen structure may then be grinded and polished to from a flat surface with the desired optical characteristics.

The etching and filling process of FIGS. 15 and 16 may also be used to form the acrylic screen of FIG. 8. Similarly, the wired LED of FIG. 13 may be used with the pre-formed screen of FIG. 8. Other combinations and modifications may be made to the illustrated operations and configurations. These operations may be adapted for multiple LEDs and for a variety of different shaped, configured, and mounted screen structures.

While the above fabrication examples show only the use of molding compound 710, 814 as a cover over a die and substrate, other types of covers may also or alternatively be used with appropriate modifications to the process including plastic, and metal covers.

Figure 17:
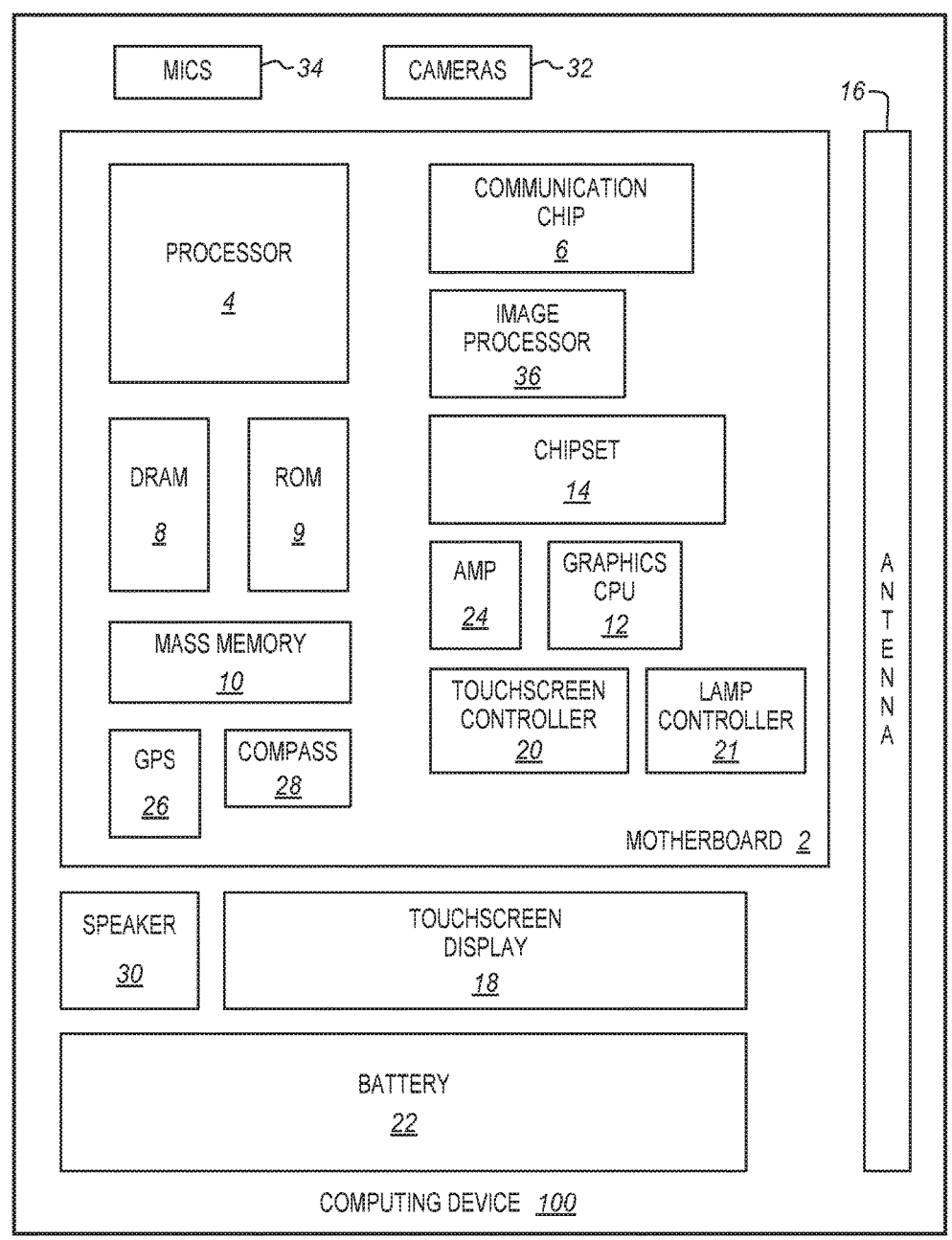
FIG. 17 is a block diagram of a computing device suitable for use with embodiments.

FIG. 17 illustrates a computing device 100 in accordance with an embodiment. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a haptic actuator array 21, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD)) (not shown), digital versatile disk (DVD)) (not shown), and so forth). These components may be connected to the system board 2, mounted to the system board, or combined with any of the other components.

The communication chip 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. In some implementations, the packages that include the processor, memory devices, communication devices, or other components may include one or more lamps and screens as described herein, if desired. The system may include one or more lamp controllers 21 to control the back side illumination as described. These may be formed on separate dies or incorporated into another component. The lamp controllers may be placed in several different locations and formed on several different substrates. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be any other electronic device that processes data.

Embodiments may be adapted to be used with a variety of different types of packages for different implementations. References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a package substrate, a die attached to the package substrate, a cover over the die and the package substrate, a lamp, and a screen over the die, externally visible and optically coupled to the lamp so that when the lamp is illuminated the illumination is externally visible through the screen.

In further embodiments the screen has a diffusion surface molded on a side opposite the die.

Further embodiments include a chamber below the screen and coupled to the lamp to receive illumination from the lamp so that the illumination in the chamber is visible through the screen.

Further embodiments include a light guide between the lamp and the chamber to conduct light from the lamp to the chamber.

In further embodiments the light guide is formed through the cover.

Further embodiments include standoffs to support the chamber at a distance over the die.

In further embodiments the lamp is mounted to the package substrate and receives power from the package substrate.

In further embodiments the lamp is mounted to the die on a side of the die opposite the substrate and wherein the lamp is electrically connected to the substrate by wires between the lamp and the substrate.

In further embodiments the lamp is mounted to the die on a side of the die that is opposite the substrate and electrically connected to the die through back side through silicon vias in the die.

Further embodiments include a chamber below the screen and coupled to the lamp through a light guide to receive illumination from the lamp through the light guide, the chamber being supported by standoffs over the die, wherein the light guide is formed through a standoff.

Further embodiments include a lamp controller die attached to the package substrate and coupled to the lamp to control the operation of the lamp.

In further embodiments the die is attached to the package substrate and wherein the lamp controller die is couple to the die through the package substrate.

Some embodiments pertain to a method that includes attaching a die to a package substrate, attaching a lamp to the package substrate, applying a molding compound over the die and the package substrate, forming a screen over the die, the screen being optically coupled to the lamp so that when the lamp is illuminated, the illumination is visible through the screen, and polishing the molding compound and the screen.

In further embodiments forming a screen over the die comprises forming a screen and attaching the screen over the die before applying the molding compound wherein applying the molding compound comprises applying the molding compound over the screen.

In further embodiments forming a screen over the die comprises forming a well in the molding compound and pouring a material into the well to form the screen.

In further embodiments attaching the lamp comprises attaching the lamp using wires between the lamp and the substrate.

Some embodiments pertain to a system that includes an external housing, the housing having a window, a system board within the housing, and a package attached to the system board, the package having an illumined backside positioned so that the illumination is visible through the window, the package having a package substrate, a die attached to the package substrate, a cover over the die and the package substrate, a lamp to generate the illumination, and a screen over the die, externally visible and optically coupled to the lamp so that when the lamp is illuminated the illumination is externally visible through the screen.

In further embodiments the lamp is attached to a side of the die opposite the package substrate and wherein the screen is over the lamp, the package further comprising a light guide to guide light from the lamp to the screen.

Further embodiments include a lamp controller attached to the system board to control the illumination of the lamp.

What is claimed is:

1. An apparatus comprising:
   a package substrate;
   a die attached to the package substrate;
   a cover over the die and the package substrate;
   a lamp; and
   a screen over the die, externally visible and optically coupled to the lamp so that when the lamp is illuminated the illumination is externally visible through the screen.

2. The apparatus of claim 1, wherein the screen has a diffusion surface molded on a side opposite the die.

3. The apparatus of claim 1, wherein the screen fills a chamber over the die and coupled to the lamp to receive illumination from the lamp so that the illumination in the chamber is visible through the screen.

4. The apparatus of claim 3, further comprising a light guide between the lamp and the chamber to conduct light from the lamp to the chamber.

5. The apparatus of claim 4, wherein the light guide is formed through the cover.

6. The apparatus of claim 3, further comprising standoffs to support the screen at a distance over the die.

7. The apparatus of claim 1, wherein the lamp is mounted to the package substrate and receives power from the package substrate.

8. The apparatus of claim 1, wherein the lamp is mounted to the die on a side of the die opposite the substrate and wherein the lamp is electrically connected to the substrate by wires between the lamp and the substrate.

9. The apparatus of claim 1, wherein the lamp is mounted to the die on a side of the die that is opposite the substrate and electrically connected to the die through silicon vias in the die.

10. The apparatus of claim 9, wherein the screen fills a chamber over the die, the screen being coupled to the lamp through a light guide to receive illumination from the lamp through the light guide, the screen being supported by standoffs over the die, wherein the light guide is formed through a standoff.

11. The apparatus of claim 10, wherein the lamp is attached within the light guide.

12. The apparatus of claim 1, further comprising a lamp controller die attached to the package substrate and coupled to the lamp to control the operation of the lamp.

13. The apparatus of claim 12, wherein the die is attached to the package substrate and wherein the lamp controller die is couple to the die through the package substrate.

14. A method comprising:
attaching a die to a package substrate;
attaching a lamp to the package substrate;
applying a molding compound over the die and the package substrate;
forming a screen over the die, the screen being optically coupled to the lamp so that when the lamp is illuminated, the illumination is visible through the screen; and
polishing the molding compound and the screen.

15. The method of claim 14, wherein forming a screen over the die comprises forming a screen and attaching the screen over the die before applying the molding compound wherein applying the molding compound comprises applying the molding compound over the screen.

16. The method of claim 14, wherein forming a screen over the die comprises forming a well in the molding compound and pouring a material into the well to form the screen.

17. The method of claim 14, wherein attaching the lamp comprises attaching the lamp using wires between the lamp and the substrate.

18. A system comprising:
an external housing, the housing having a window;
a system board within the housing; and
a package attached to the system board, the package having an illumined backside positioned so that the illumination is visible through the window, the package having a package substrate, a die attached to the package substrate, a cover over the die and the package substrate, a lamp to generate the illumination, and a screen over the die, externally visible and optically coupled to the lamp so that when the lamp is illuminated the illumination is externally visible through the screen.

19. The system of claim 18, wherein the lamp is attached to a side of the die opposite the package substrate and wherein the screen is over the lamp, the package further comprising a light guide to guide light from the lamp to the screen.

20. The system of claim 18, further comprising a lamp controller attached to the system board to control the illumination of the lamp.

* * * * *